(12) United States Patent
Nakashima et al.

(10) Patent No.: US 9,578,774 B2
(45) Date of Patent: Feb. 21, 2017

(54) ELECTRONIC COMPONENT UNIT (71) Applicant: Yazaki Corporation, Tokyo (JP)

(72) Inventors: Akinori Nakashima, Makinohara (JP); Yoshiya Miyazaki, Makinohara (JP)

(73) Assignee: YAZAKI CORPORATION, Tokyo (JP)

(*) Notice: Subject to any disclaimer, the term of this patent is extended or adjusted under 35 U.S.C. 154(b) by 0 days.

(21) Appl. No.: 14/729,532

(22) Filed: Jun. 3, 2015

(65) Prior Publication Data
US 2015/0359112 A1 Dec. 10, 2015

(30) Foreign Application Priority Data

Jun. 6, 2014 (JP) ................................. 2014-117922

(51) Int. Cl.
H05K 5/02 (2006.01)
H05K 7/02 (2006.01)
B60R 16/023 (2006.01)

(52) U.S. Cl.
CPC ......... *H05K 7/026* (2013.01); *B60R 16/0238* (2013.01); *H05K 5/0247* (2013.01)

(58) Field of Classification Search
CPC .................... H05K 5/0247; B60R 16/0238
USPC ....................................... 174/520
See application file for complete search history.

(56) References Cited

U.S. PATENT DOCUMENTS

| | | | |
|---|---|---|---|
| 2008/0009154 A1* | 1/2008 | Kanou | B60R 16/0239 439/76.2 |
| 2008/0299800 A1* | 12/2008 | Yoshida | H01R 13/5227 439/76.2 |
| 2013/0194763 A1* | 8/2013 | Yoon | B60R 16/0238 361/752 |
| 2013/0250489 A1 | 9/2013 | Toda et al. | |
| 2015/0230352 A1* | 8/2015 | Hashikura | H02G 3/08 174/547 |

FOREIGN PATENT DOCUMENTS

JP 2013198347 A 9/2013

* cited by examiner

*Primary Examiner* — Hung V Ngo
(74) *Attorney, Agent, or Firm* — Sughrue Mion, PLLC (57) ABSTRACT An electronic component unit includes a housing which accommodates an electronic component therein, which includes a bottom surface in a vertical direction and a side wall surface, and to which a connection portion with electric wire is provided on the bottom surface. The bottom surface of the housing includes an inclined surface. One side of the inclined surface disposed on a side of the side wall surface is positioned at a lower position in the vertical direction than the other side of the inclined surface disposed on a side of the connection portion.

5 Claims, 7 Drawing Sheets

SHORT-SIDE DIRECTION

LONG-SIDE DIRECTION

FIG. 6

SHORT-SIDE DIRECTION

LONG-SIDE DIRECTION

ELECTRONIC COMPONENT UNIT

BACKGROUND

The present invention relates to an electronic component unit.

As an electronic component unit which is mounted on a vehicle or the like in the related art, for example, an electronic component module including an electronic component substrate on which a plurality of bus bars are attached to an insulating board and a plurality of electronic components are electrically connected to the plurality of bus bars, and a case which houses the electronic component substrate, in which outer terminal connection portions which are provided in each bus bar are collected and a connector connection portion is formed, is disclosed in Patent Document 1. Since the connector connection portion is disposed between the plurality of electronic components, the electronic component module achieves a small size in the unit.
[Patent Document 1] JP-A-2013-198347

SUMMARY

However, in the electronic component unit in the above-described Patent Document 1, for example, when water is adhered to the case (housing), it is desirable that the adhered water is not adhered to a connector (connection portion) which is exposed to the outside of the case.

In consideration of the above-described situation, an object of the present invention is to provide an electronic component unit which can suppress adhesion of water to a connection portion.

In order to achieve the above-described object, there is provided an electronic component unit, comprising:

a housing which accommodates an electronic component therein, which includes a bottom surface in a vertical direction and a side wall surface, and to which a connection portion with electric wire is provided on the bottom surface, wherein the bottom surface of the housing includes an inclined surface, and wherein one side of the inclined surface disposed on a side of the side wall surface is positioned at a lower position in the vertical direction than the other side of the inclined surface disposed on a side of the connection portion.

In addition, in the electronic component unit, the housing may include a connection portion fitting portion to which the connection portion is fitted, and the housing may include a reinforcing rib which is formed at a position at a certain interval from the side wall surface and connects the connection portion fitting portion and the inclined surface.

In addition, in the electronic component unit, the housing may include a water drainage portion which is a part of the side wall surface protruding lower in the vertical direction than the bottom surface.

DETAILED DESCRIPTION OF EXEMPLIFIED EMBODIMENTS

Hereinafter, an embodiment according to the present invention will be described in detail based on the drawings. In addition, the invention is not limited to the embodiment. In addition, in constituent elements in the following embodiment, elements which can be easily replaced by those skilled in the art, or substantially the same elements are included.

Figure 1:
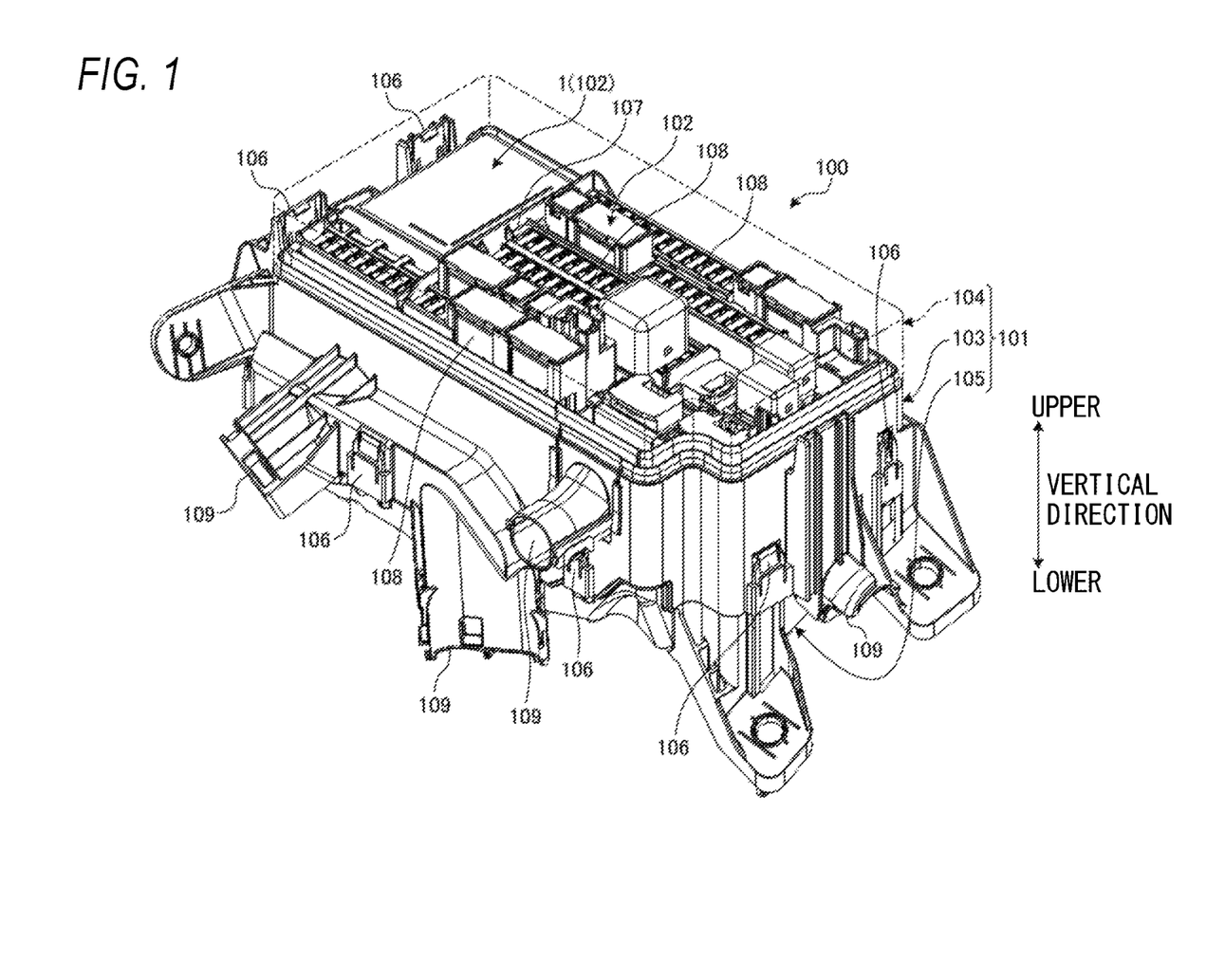
FIG. 1 is a perspective view illustrating a schematic configuration of an electricity connection box in which an electronic component unit according to an embodiment is employed.
Figure 2:
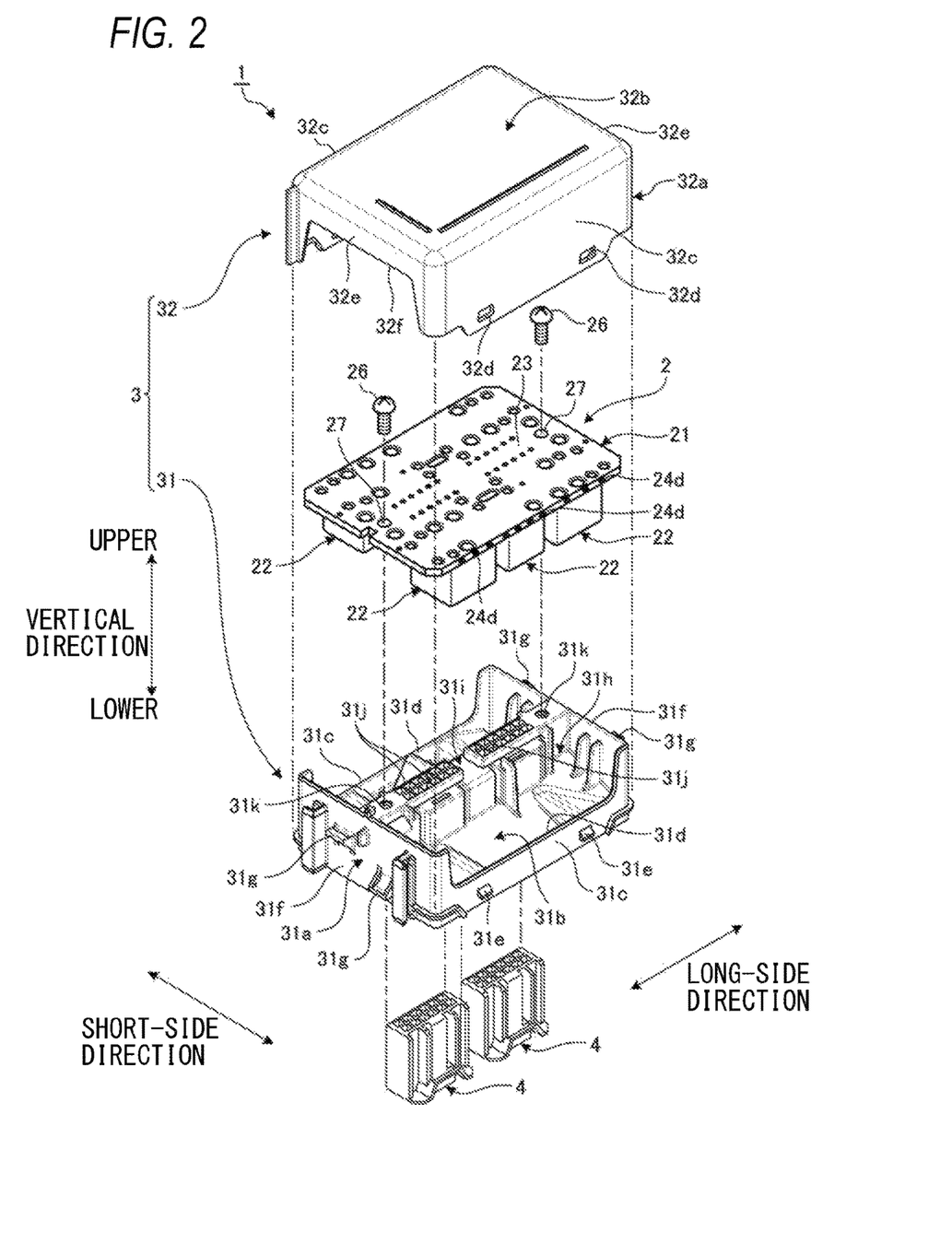
FIG. 2 is an exploded perspective view illustrating a schematic configuration of the electronic component unit according to the embodiment.
Figure 3:
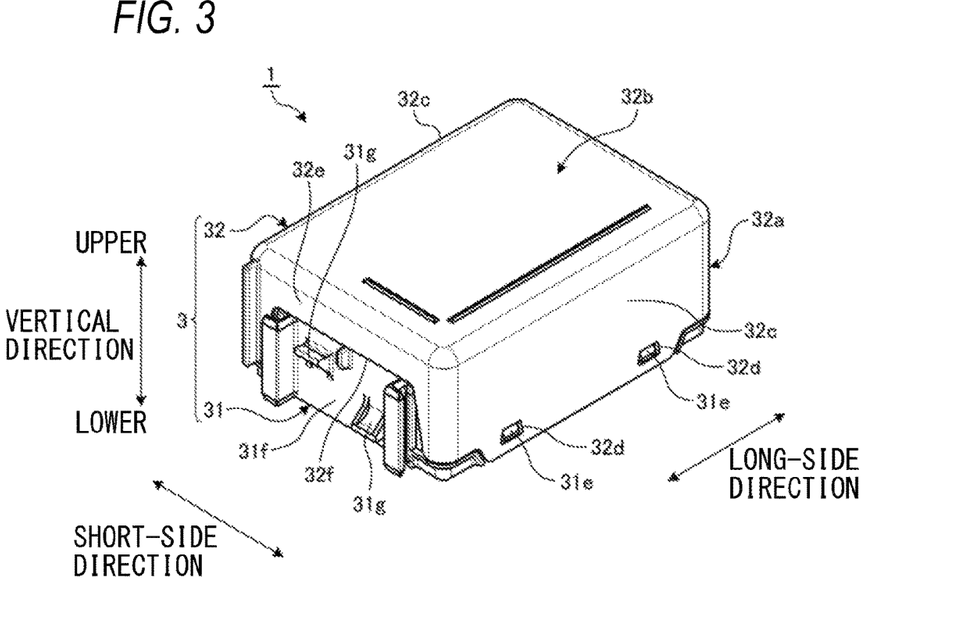
FIG. 3 is a perspective view illustrating the schematic configuration of the electronic component unit according to the embodiment.
Figure 4:
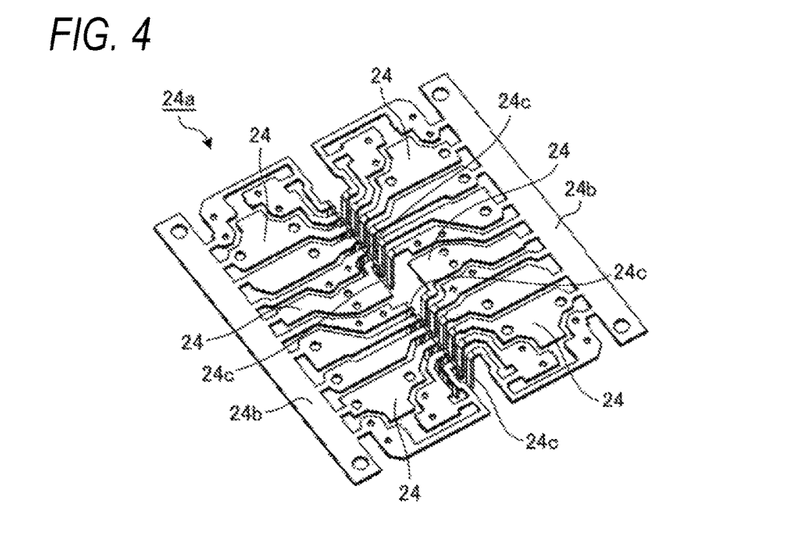
FIG. 4 is a perspective view illustrating a bus bar of the electronic component unit according to the embodiment.
Figure 5:
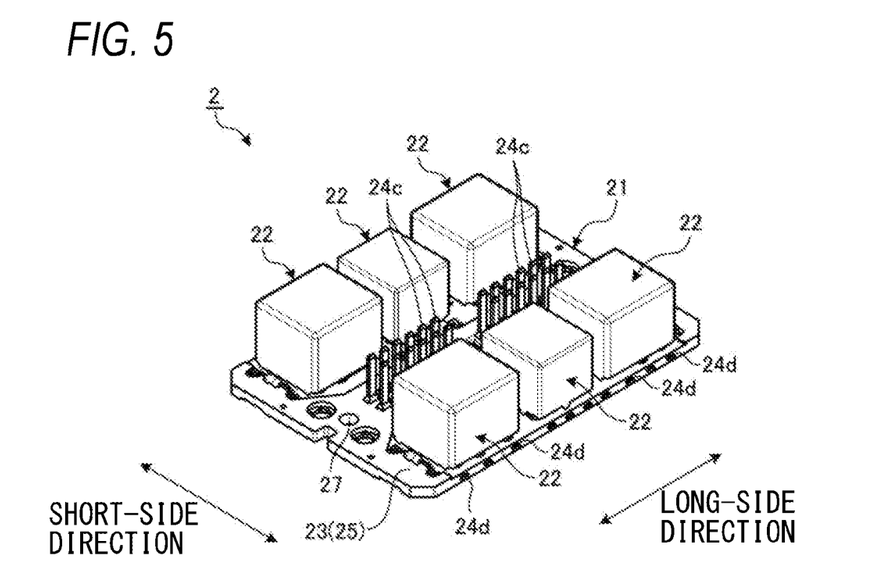
FIG. 5 is a perspective view illustrating a schematic configuration of an inserted bus bar plate of the electronic component unit according to the embodiment.
Figure 6:
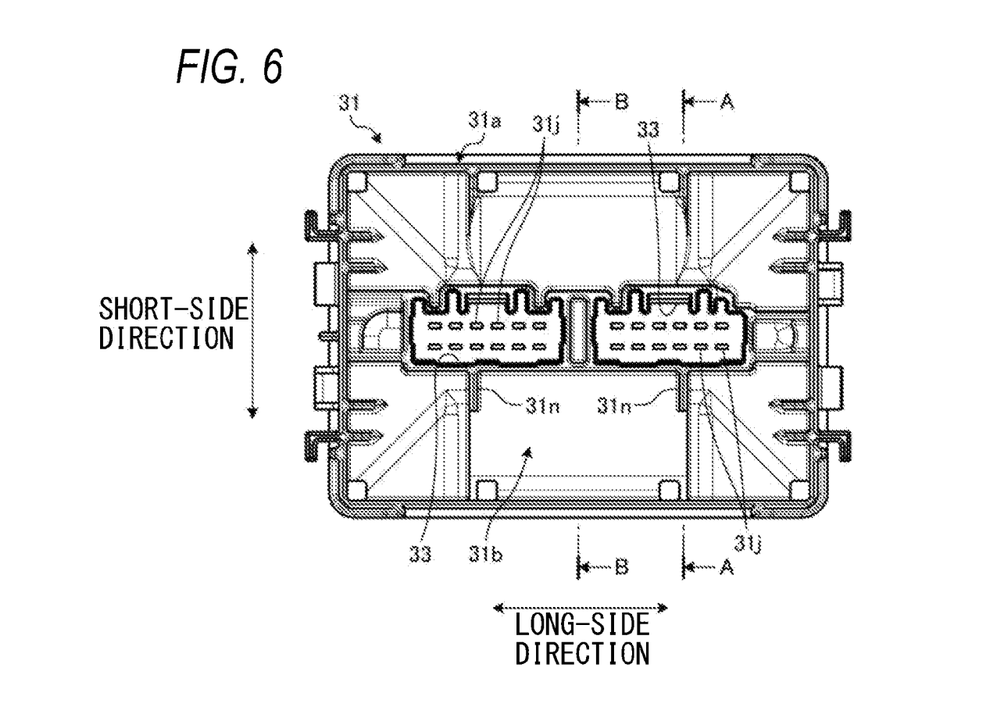
FIG. 6 is a plan view of a connector fitting portion side of a base cover of the electronic component unit according to the embodiment.
Figure 7:
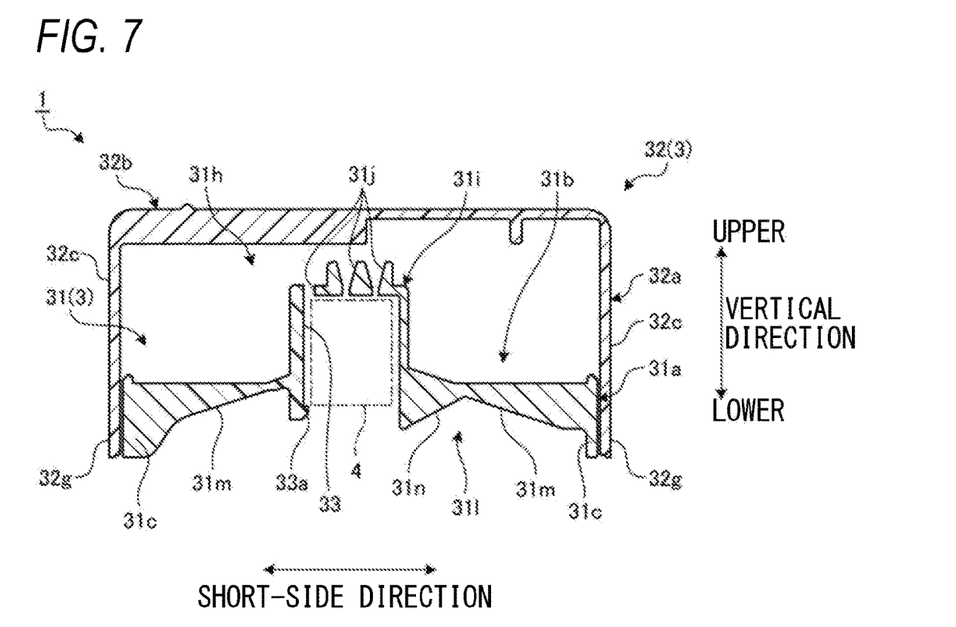
FIG. 7 is a sectional view along line VII-VII of FIG. 6.
Figure 8:
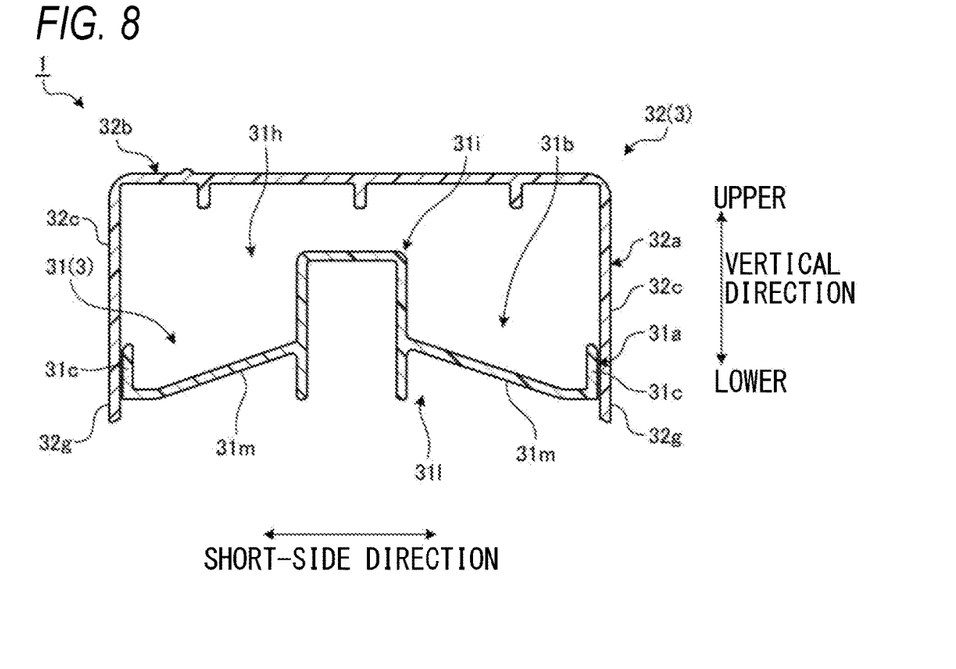
FIG. 8 is a sectional view along line VIII-VIII of FIG. 6.
Figure 9:
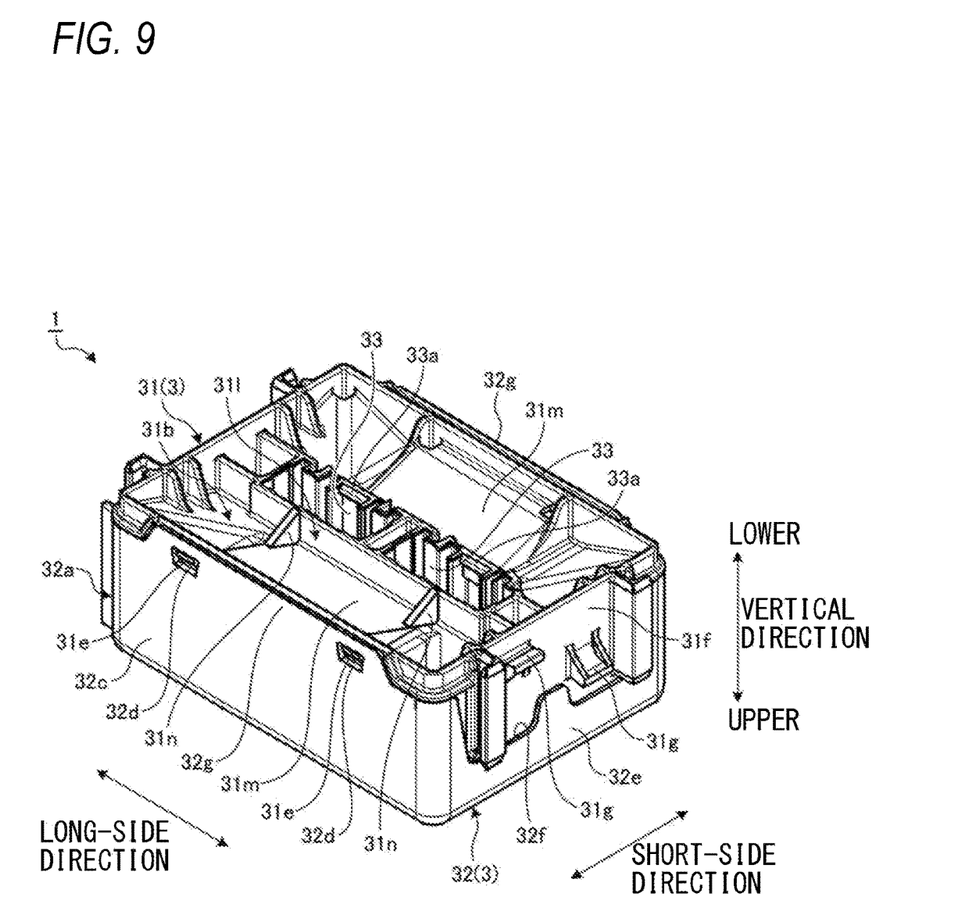
FIG. 9 is a perspective view of the connector fitting portion side illustrating the schematic configuration of the electronic component unit according to the embodiment.
Figure 10:
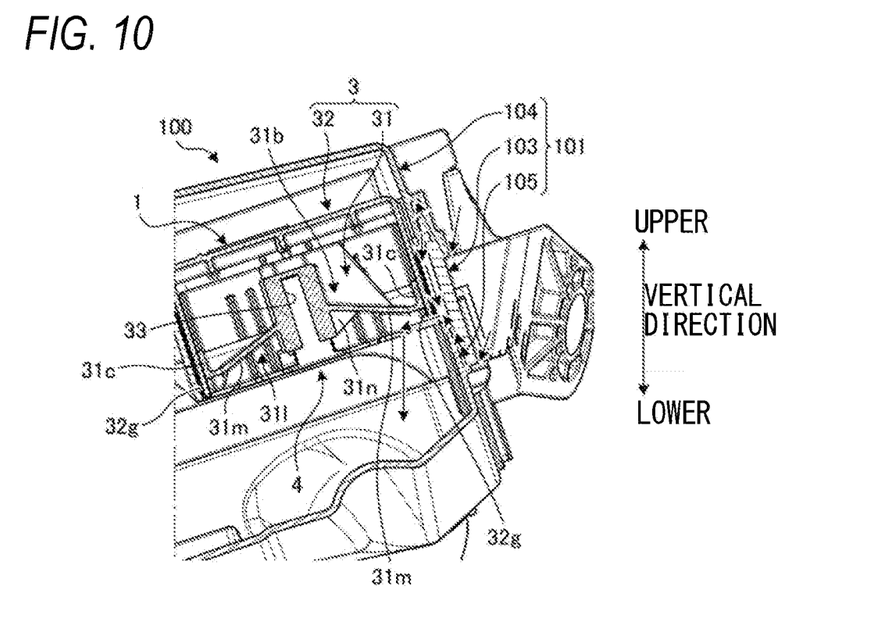
FIG. 10 is a partial sectional view including the electronic component unit according to the embodiment.
Figure 11:
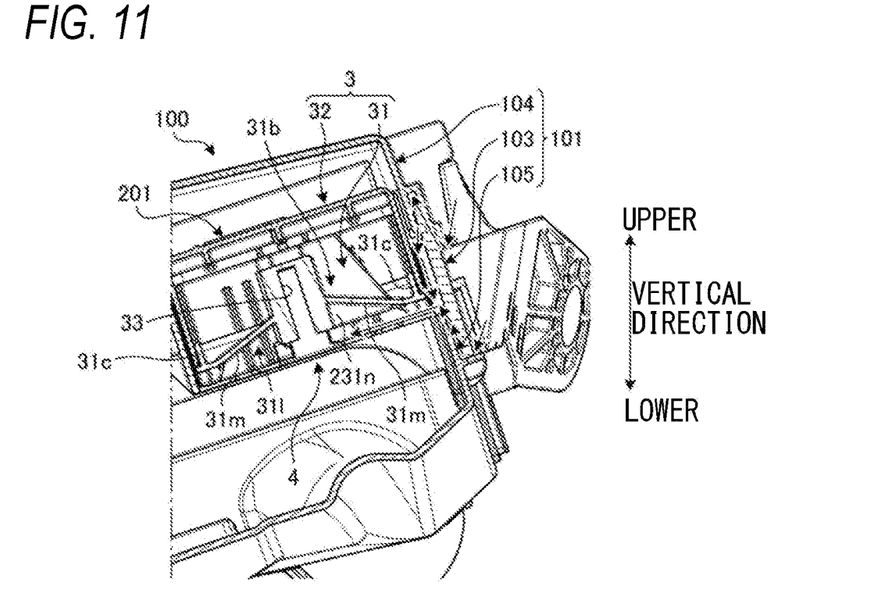
FIG. 11 is a partial sectional view including an electronic component unit according to a comparative example.

FIG. 1 is a perspective view illustrating a schematic configuration of an electricity connection box in which an electronic component unit according to an embodiment is employed. FIG. 2 is an exploded perspective view illustrating a schematic configuration of the electronic component unit according to the embodiment. FIG. 3 is a perspective view illustrating the schematic configuration of the electronic component unit according to the embodiment. FIG. 4 is a perspective view illustrating a bus bar of the electronic component unit according to the embodiment. FIG. 5 is a perspective view illustrating a schematic configuration of an inserted bus bar plate of the electronic component unit according to the embodiment. FIG. 6 is a plan view of a connector fitting portion side of a base cover of the electronic component unit according to the embodiment. FIG. 7 is a sectional view along line VII-VII of FIG. 6. FIG. 8 is a sectional view along line VIII-VIII of FIG. 6. FIG. 9 is a perspective view of the connector fitting portion side illustrating the schematic configuration of the electronic component unit according to the embodiment. FIG. 10 is a partial sectional view including the electronic component unit according to the embodiment. FIG. 11 is a partial sectional view including an electronic component unit according to a comparative example. In addition, in FIG. 1, an upper cover of the electronic connection box is illustrated with a two-dot chain line. In addition, in FIGS. 7 and 8, in order to make it easy to understand, the inserted bus bar plate or the like is omitted.

As illustrated in FIG. 1, an electronic component unit 1 which serves as the electronic component unit according to the embodiment constitutes an electronic component module which is assembled to be attachable to and detachable from an electricity connection box 100 mounted on a vehicle, such as an automobile. Here, the electricity connection box 100 aggregates and houses electrical components, such as a connector that constitutes a connection processing component, including a wire harness or an electric wire, a fuse, a relay, a branching portion, or an electronic control unit, therein. The electricity connection box 100 is installed, for example, in an engine compartment of the vehicle or at a lower part of a vehicle body, and is connected between a power source, such as a battery, and various electronic devices which are mounted in the vehicle. The electricity connection box 100 distributes electric power supplied from the power source to various electronic devices in the vehicle. In addition, there is a case where the electricity connection box 100 is called a junction box, a fuse box, a relay box or the like, but the electric connection box is a general term for these in the embodiment.

The electricity connection box 100 illustrated in FIG. 1 houses various electronic components 102 in a housing space portion inside a box main body 101. For example, the box main body 101 is configured of a body 103, an upper cover 104, a lower cover 105 and the like. The box main body 101 has a three-layer separated structure in which the body 103, the upper cover 104, and the lower cover 105 are separated from each other. The body 103, the upper cover 104, and the lower cover 105 are formed of an insulating synthetic resin. The body 103 is a member which mainly forms the housing space portion in which the electronic components 102 are assembled. The body 103 is formed in the shape of a tube which is substantially square, and in a state where the electricity connection box 100 is connected to the engine compartment or the like, an opening is positioned on an upper side in a vertical direction and on a lower side in the vertical direction. The upper cover 104 is a member having the shape of a lid that blocks the opening on the upper side in the vertical direction of the body 103. The lower cover 105 is a member having the shape of a tray that blocks the opening on the lower side in the vertical direction of the body 103. In the box main body 101, the opening on the upper side in the vertical direction of the body 103 and the opening of the upper cover 104 oppose each other, the opening on the lower side in the vertical direction of the body 103 and the opening of the lower cover 105 oppose each other, the upper cover 104 is assembled on the upper side in the vertical direction of the body 103, and the lower cover 105 is assembled on the lower side in the vertical direction of the body 103. In the box main body 101, the upper cover 104 and the lower cover 105 are locked to the body 103 via a locking mechanism 106 which may have various shapes. In addition, a direction in which the body 103, the upper cover 104, and the lower cover 105 are layered is typically along the vertical direction in a state where the electricity connection box 100 is connected to the engine compartment or the like, but there is a case where the direction of the layering is set to have a predetermined angle with respect to the vertical direction according to an installation state of the electricity connection box 100.

In addition, examples of the various electronic components 102 which are assembled in the housing space portion inside the box main body 101 include a connector, a fuse, a relay, a branching portion, an electronic control unit, or the electronic component unit 1 of the embodiment, as described above. In the electricity connection box 100, various electronic components 102 are assembled in multiple cavities which are formed by partition walls 107 having various shapes formed to be formed integrally with the body 103, and blocks 108 having various shapes assembled to be attachable to and detachable from the body 103. In this case, the partition wall 107 and the block 108 are also formed of an insulating synthetic resin, similarly to the body 103 or the like. In addition, in the electricity connection box 100, terminals or the like of electric wires which are routed via an opening portion 109 are fitted from the lower side in the vertical direction and electrically connected to the cavities to which various electronic components 102 are assembled.

In addition, as illustrated in FIGS. 2 to 8, the electronic component unit 1 of the embodiment includes an inserted bus bar plate 2, a housing 3, and a connector 4 which serves as a connection portion with the electric wires, and the inserted bus bar plate 2 is assembled to the inside of the housing 3.

As illustrated in FIGS. 2, 4, and 5, the inserted bus bar plate 2 is a substrate on which an electronic component 22 that has a bus bar 24 made of metal embedded inside a resin material 23 is mounted. The inserted bus bar plate 2 is configured to include a substrate main body 21 and the electronic component 22.

The substrate main body 21 has the plurality of bus bars 24 having conductivity embedded inside the resin material 23, that is, the plurality of bus bars 24 are covered with the insulating resin material 23 and are insulated from each other. For example, the substrate main body 21 is formed by insert molding in which an insulating resin is injected around the bus bar 24 that is formed of a conductive metal and disposed in a mold and integrates the metal and the resin.

A bus bar aggregate 24a before molding illustrated in FIG. 4 indicates an aggregate of the bus bars 24 before the insert molding is performed which links the plurality of bus bars 24 by a carrier 24b. The bus bar aggregate 24a before molding is an aggregate which is formed of a conductive metal, and for example, the entire aggregate is formed in the shape of a substantial plate by press working or the like. The bus bar aggregate 24a before molding is inserted into the mold for insert molding in a state where terminals 24c of each bus bar 24 are bent. The substrate main body 21 is formed by injecting the insulating resin around the bus bar aggregate 24a before molding which is inserted in the mold and by molding integrally each bus bar 24 and the resin material 23. In addition, in the substrate main body 21, after each bus bar 24 and the resin material 23 are molded integrally, the carrier 24b is cut. The entire substrate main body 21 is formed in the shape of a rectangular plate.

As illustrated in FIG. 5 or the like, in the insert-molded substrate main body 21, the terminals 24c of each bus bar 24 are positioned to be aligned along a long-side direction (a second width direction which intersects with a first width direction) in a substantially central portion in a short-side direction (first width direction). Here, the terminals 24c are aligned in two rows along the long-side direction. Each terminal 24c stands substantially perpendicularly with respect to a mounting surface 25 which is a surface on which the electronic component 22 is mounted in the substrate main body 21. In other words, each terminal 24c extends and protrudes from the mounting surface 25 along a direction which is orthogonal to the short-side direction and the long-side direction. Each of the terminals 24c is positioned between the plurality of electronic components 22 which will be described later with respect to the short-side direction. In other words, the plurality of terminals 24c are aggregated in the central portion of the mounting surface 25. In addition, in the substrate main body 21, in each bus bar 24, an end portion on a side which is linked to the carrier 24b cut after the insert molding becomes an exposed end portion 24d which is exposed from the resin material 23 on an end surface of the substrate main body 21. In other words, on the inserted bus bar plate 2, the plurality of exposed end portions 24d of the bus bar 24 are exposed on the end surface. The exposed end portions 24d are respectively formed on one pair of end surfaces of long sides which oppose each other in the substrate main body 21. The plurality of exposed end portions 24d are exposed to be aligned in the long-side direction on the end surfaces of each long side.

The electronic component 22 is mounted on the mounting surface 25 of the substrate main body 21, and here, is an element which performs various functions. In the electronic component 22, each terminal is electrically connected to the predetermined bus bars 24, and is fixed by soldering or the like on a rear surface of the mounting surface 25. The electronic component 22 of the embodiment, is for example, a relay. In other words, the electronic component unit 1 of the embodiment is a relay unit module. In the inserted bus bar plate 2 of the embodiment, a total of six relays which serve as the electronic components 22 are provided three by three and are aligned along the long-side direction on both sides in the short-side direction of each terminal 24c. In other words, in the inserted bus bar plate 2, the electronic components 22 disposed in two rows, and the plurality of terminals 24c are disposed in two rows between the electronic components 22 disposed in two rows. Basically, the inserted bus bar plate 2 of the embodiment has a substantially axial-symmetrical shape with respect to a center line (that is, a center line in the short-side direction) along the long-side direction of the substrate main body 21, and disposition of the terminals 24c and the electronic components 22 is substantially axial-symmetrical. In addition, on the inserted bus bar plate 2, an element, such as a relay resistance or the like, is also mounted in addition to the six relays which serve as the electronic components 22.

As illustrated in FIGS. 2, 3, 6, 7, and 8, the housing 3 includes a base cover 31 which serves as a base portion, a top cover 32 which serves as a lid portion, and a connector fitting portion 33 which serves as a connection portion fitting portion. The base cover 31 is a cover to which the inserted bus bar plate 2 is assembled. The top cover 32 is a cover which covers the inserted bus bar plate 2 which is assembled to the base cover 31 from a side opposite to the base cover 31. The connector fitting portion 33 is a portion to which the connector 4 that is a connection portion between the terminal 24c of the bus bar 24 and the electric wires is fitted, and is formed integrally with the base cover 31. The base cover 31, the top cover 32, and the connector fitting portion 33 are formed of an insulating synthetic resin.

Specifically, as illustrated in FIG. 2, the base cover 31 is a member having the shape of a tray. The base cover 31 is configured to include a rectangular frame-shaped portion 31a which is formed in a shape which is substantially square, and a bottom portion 31b which blocks the rectangular frame-shaped portion 31a. The bottom portion 31b is formed in the shape of a rectangular plate which is similar to that of the substrate main body 21 of the inserted bus bar plate 2. The rectangular frame-shaped portion 31a is formed to surround an edge portion of the bottom portion 31b. The bottom portion 31b is formed integrally with the rectangular frame-shaped portion 31a. In the rectangular frame-shaped portion 31a, notches 31d are respectively formed on one pair of long-side wall surfaces 31c along the long-side direction of the bottom portion 31b, and an engagement claw 31e which is engaged with the top cover 32 is formed. In addition, in the rectangular frame-shaped portion 31a, engagement claws 31g which are engaged with the box main body 101 of the electricity connection box 100 are respectively formed on one pair of short-side wall surfaces 31f along the short-side direction of the bottom portion 31b. The base cover 31 is partitioned as a housing space portion 31h in which a space portion which is surrounded by the rectangular frame-shaped portion 31a and the bottom portion 31b houses the electronic component 22 of the inserted bus bar plate 2.

In addition, in the base cover 31, a center wall-shaped portion 31i is formed in the central portion of the bottom portion 31b. In the center wall-shaped portion 31i, the bottom portion 31b is formed to protrude on the housing space portion 31h side. The center wall-shaped portion 31i is formed along the long-side direction in the substantially central portion in the short-side direction of the bottom portion 31b. The center wall-shaped portion 31i extends from one short-side wall surface 31f to the other short-side wall surface 31f along the long-side direction. In the center wall-shaped portion 31i, a plurality of terminal fitting holes 31j and one pair of screw holes 31k are formed on a tip end surface. When the inserted bus bar plate 2 is assembled to the base cover 31, the terminal fitting holes 31j are holes into which the terminals 24c of each of the above-described bus bars 24 are fitted, and are formed such that the number and the position thereof correspond to those of the terminals 24c. Here, the terminal fitting holes 31j are aligned in two rows along the long-side direction. When the inserted bus bar plate 2 is assembled to the base cover 31, the screw hole 31k becomes a hole into which a screw 26 for fastening the inserted bus bar plate 2 to the base cover 31 is screwed.

Furthermore, as illustrated in FIGS. 6, 7, and 9, in the base cover 31, a rear surface side of the center wall-shaped portion 31i, that is, a side opposite to the housing space portion 31h, has a hollow shape, and the center part thereof is formed as the connector fitting portion 33 to which the connector 4 that is a connection portion with the electric wires is fitted. The terminals 24c of each of the above-described bus bars 24 are exposed to the inside of the connector fitting portion 33 via each terminal fitting hole 31j in a state where the inserted bus bar plate 2 is assembled to the base cover 31. Here, the connector fitting portions 33 are formed at two locations, and a total of two of the connectors 4 are respectively fitted to the two connector fitting portions 33 one by one. In other words, in the electronic component unit 1 of the embodiment, two connectors 4 are connected to the terminals 24c of the plurality of bus bars 24.

As illustrated in FIG. 2, the top cover 32 is a lid-shaped member. The top cover 32 is configured to include a rectangular frame-shaped portion 32a which is formed in a shape of a substantial square, and a ceiling portion 32b which blocks one opening of the rectangular frame-shaped portion 32a. The ceiling portion 32b is formed in the shape of a rectangular plate which is similar to the shape of the substrate main body 21 of the inserted bus bar plate 2 and the bottom portion 31b of the base cover 31. The rectangular frame-shaped portion 32a is formed to stand in an edge portion of the ceiling portion 32b. In the rectangular frame-shaped portion 32a, an engagement recessed portion 32d which is engaged with the base cover 31 is formed on one pair of long-side wall surfaces 32c along the long-side direction of the ceiling portion 32b. In addition, in the rectangular frame-shaped portion 32a, notches 32f are respectively formed on one pair of short-side wall surfaces 32e along the short-side direction of the ceiling portion 32b. The top cover 32 is formed in the shape of a rectangular tube (a part thereof is cut out by the notch 32f) in which one end is opened and the other end is blocked by the rectangular frame-shaped portion 32a and the ceiling portion 32b.

As illustrated in FIGS. 2 and 3, in the electronic component unit 1 configured as described above, in a state where the inserted bus bar plate 2 is assembled to the base cover 31, and a side opposite to the base cover 31 of the inserted bus bar plate 2 is covered with the top cover 32, the connector 4 constitutes one module when fitted to the connector fitting portion 33.

More specifically, in the electronic component unit 1, in a positional relationship in which the electronic component 22 of the inserted bus bar plate 2 is housed in the housing space portion 31$h$ of the base cover 31, that is, in a positional relationship in which the mounting surface 25 (refer to FIG. 5 or the like) on which the electronic component 22 is mounted opposes the bottom portion 31$b$ of the base cover 31, the inserted bus bar plate 2 is assembled to the base cover 31. In the electronic component unit 1, in a state where the inserted bus bar plate 2 is assembled to the base cover 31, the terminals 24$c$ of the plurality of bus bars 24 of the inserted bus bar plate 2 are fitted to each terminal fitting hole 31$j$ of the base cover 31, and the terminals 24$c$ are exposed to the inside of the connector fitting portion 33 along the direction which is orthogonal to the short-side direction and the long-side direction. In the electronic component unit 1, when inserted in a screw hole 27 of the inserted bus bar plate 2 and screwed into the screw hole 31$k$ of the base cover 31, the inserted bus bar plate 2 and the base cover 31 are fastened to each other. In the electronic component unit 1, in a state where the inserted bus bar plate 2 is assembled to the base cover 31, the electronic components 22 are positioned three by three on both sides in the short-side direction of the center wall-shaped portion 31$i$.

In the electronic component unit 1, in a positional relationship in which the inserted bus bar plate 2 which is assembled to the base cover 31 is covered with the top cover 32 from the side opposite to the base cover 31, the top cover 32 is mounted with respect to the base cover 31 or the like. In the electronic component unit 1, in a state where the top cover 32 is mounted at an appropriate position, as each engagement recessed portion 32$d$ on the top cover 32 side is engaged with each engagement claw 31$e$ on the base cover 31 side, the top cover 32 is assembled to the base cover 31. As illustrated in FIG. 3 or the like, in the electronic component unit 1, in a state where the top cover 32 is assembled to the base cover 31, the rectangular frame-shaped portion 32$a$ of the top cover 32 is positioned to overlap with the outside of the rectangular frame-shaped portion 31$a$ of the base cover 31, and the engagement claw 31$g$ is exposed from the notch 32$f$ of the top cover 32. In addition, in the electronic component unit 1, as the connector 4 is fitted to the connector fitting portion 33 along the direction which is orthogonal to the short-side direction and the long-side direction, the connector 4 is connected to the terminals 24$c$ of the plurality of bus bars 24, and is assembled at the predetermined installation position inside the box main body 101 of the electricity connection box 100 via each engagement claw 31$g$.

In addition, similarly to the above-described electricity connection box 100, a direction in which the base cover 31, the inserted bus bar plate 2, and the top cover 32 are layered is along the vertical direction in a state where the electricity connection box 100 is connected to the engine compartment or the like. However, due to an installation state of the electricity connection box 100, there is also a case where the direction of the layering is set to have a predetermined angle with respect to the vertical direction.

However, as illustrated in FIG. 10 or the like, the electricity connection box 100 of the embodiment basically has a waterproof structure which does not allow the water to infiltrate into the box main body 101 because of a double wall or the like at a part where the body 103, the upper cover 104, and the lower cover 105 are connected to each other. However, even in this case, the electronic component unit 1 of the embodiment employs a configuration in which the water is assumed to be capable of infiltrating the box main body 101.

Specifically, as illustrated in FIGS. 2, 6, 7, 8, and 9, in the housing 3 of the electronic component unit 1 of the embodiment, the connector 4 which houses the electronic component 22 therein and is a connection portion with the electric wires is provided on a vertical-directional lower surface 31$l$ (a bottom surface). Here, the vertical-directional lower surface 31$l$ of the housing 3 is a rear surface side of the bottom portion 31$b$ of the base cover 31, that is, a surface on a side opposite to the housing space portion 31$h$ of the bottom portion 31$b$. In addition, in the description below, unless there is a notice, a positional relationship in a state where the housing 3 is installed at the predetermined installation position of the vehicle will be described.

In addition, the housing 3 of the embodiment has an inclined surface 31$m$ on the vertical-directional lower surface 31$l$. The inclined surface 31$m$ is inclined so that the long-side wall surface 32$c$ side of the top cover 32 of the housing 3 provided on a side of the vertical-directional lower surface 31$l$ is positioned on a lower side in the vertical direction and the connector 4 side is positioned on an upper side in the vertical direction in a state where the housing 3 is installed at the installation position. One pair of the inclined surfaces 31$m$ of the embodiment are provided on both sides of the connector fitting portion 33 on the vertical-directional lower surface 31$l$. More specifically, each inclined surface 31$m$ extends up to the connector fitting portion 33 from the long-side wall surface 31$c$ of the base cover 31. Each inclined surface 31$m$ is inclined on the upper side in the vertical direction toward the connector fitting portion 33 side from the long-side wall surface 31$c$ side. In other words, in the housing 3 of the embodiment, in a sectional view along the short-side direction (refer to FIG. 8 or the like), the bottom portion 31$b$ which includes the vertical-directional lower surface 31$l$ is formed in a section having a shape similar to a chevron to be separated from the connector fitting portion 33 side. In addition, on each inclined surface 31$m$, each connector fitting portion 33 side becomes an uppermost end position, and the long-side wall surface 31$c$ side becomes a lowermost end position.

The electronic component unit 1 of the embodiment is installed to be inclined at a predetermined angle with respect to the short-side direction (refer to FIG. 10 or the like). Here, the electronic component unit 1 is installed in a state where one long-side wall surface 31$c$ of the base cover 31 is positioned on the lower side in the vertical direction, the other long-side wall surface 31$c$ is inclined to be positioned on the upper side in the vertical direction, and the long-side wall surface 31$c$ side which is positioned on the upper side in the vertical direction in the box main body 101 is positioned on an outer side (wall surface side of the body 103). In addition, the electronic component unit 1 of the embodiment includes at least the inclined surface 31$m$ which is inclined on the upper side in the vertical direction toward the connector fitting portion 33 side from the long-side wall surfaces 31$c$ and 32$c$ sides which are positioned on the outer side (wall surface side of the body 103) on the upper side in the vertical direction and in the box main body 101. Here, in this state, each inclined surface 31$m$ is inclined at an angle so that the long-side wall surfaces 31$c$ and 32$c$ sides are positioned on the lower side in the vertical direction, and the connector 4 side is positioned on the upper side in the vertical direction.

In addition, as illustrated in FIG. 7, 9, 10 or the like, the housing 3 of the embodiment further includes a reinforcing rib 31n. The reinforcing rib 31n is formed at a position at a certain interval from the long-side wall surface 31c and the long-side wall surface 32c of the housing 3, and connects the connector fitting portion 33 and the inclined surface 31m to each other. The reinforcing rib 31n is formed integrally with the bottom portion 31b or the like. Accordingly, the reinforcing rib 31n ensures rigidity for reinforcing the connector fitting portion 33. Here, two reinforcing ribs 31n are provided on the side surface (surface which is positioned on the wall surface side of the body 103 in an installed state) on one side in the short-side direction of the connector fitting portion 33. Each of the reinforcing ribs 31n is formed substantially in the shape of a triangle to link the side surface of the connector fitting portion 33 and the inclined surface 31m. The reinforcing ribs 31n do not come into contact with the long-side wall surface 31c. Accordingly, on the vertical-directional lower surface 31l, the housing 3 can be in a state where the inclined surface 31m remains between the reinforcing rib 31n and the long-side wall surface 31c with respect to the short-side direction.

Here, as illustrated in FIG. 7, in the connector fitting portion 33, each reinforcing rib 31n is formed on the side surface on a side opposite to the side surface on which an engagement claw 33a which is engaged is formed in a state where the connector 4 is engaged with the connector fitting portion 33. The connector fitting portion 33 tends to be easily deformed when a large stress is applied to the side surface on the side opposite to the side surface on which the engagement claw 33a is formed when the connector 4 is actually fitted thereto. For this reason, as each reinforcing rib 31n is formed on the side surface on the side opposite to the side surface on which the engagement claw 33a is formed, the electronic component unit 1 of the embodiment reinforces the side surface side and ensures appropriate rigidity. In addition, being not limited thereto, the reinforcing rib 31n may be formed on both side surfaces of the connector fitting portion 33.

Furthermore, as illustrated in FIG. 7, 8, 9, 10 or the like, the housing 3 of the embodiment includes a water drainage portion 32g. The water drainage portion 32g is formed because the long-side wall surface 32c of the top cover 32 protrudes to the lower side in the vertical direction more than the vertical-directional lower surface 31l. The water drainage portion 32g is formed in a shape of a substantial square across the entire lower end portion in the vertical direction of the rectangular frame-shaped portion 32a of the top cover 32. Here, the long-side wall surface 31c of the base cover 31 also partially protrudes to the lower side in the vertical direction more than the vertical-directional lower surface 31l.

According to the electronic component unit 1 described above, the housing 3 in which the connector 4 which houses the electronic component 22 therein is a connection portion with the electric wires provided on the vertical-directional lower surface 31l. The housing 3 has the inclined surface 31m on which the long-side wall surfaces 31c and 32c sides of the housing 3 provided on the side of the vertical-directional lower surface 31l is positioned on the lower side in the vertical direction, and the connector 4 side is positioned on the upper side in the vertical direction in a state where the housing 3 is installed at the installation position. In other words, one side of the inclined surface 31m disposed on a side of the side wall surfaces 31c, 32c is positioned at a lower position in the vertical direction than the other side of the inclined surface 31m disposed on a side of the connector 4.

Therefore, in the electronic component unit 1, for example, as illustrated by an arrow in FIG. 10, even if the water infiltrates into the box main body 101, due to the inclined surface 31m, it is possible to suppress a situation in which the water adhered to the long-side wall surface 32c or the like of the housing 3 moves to the connector 4 side across the vertical-directional lower surface 31l. As a result, in the electronic component unit 1, it is possible to suppress adhesion of the water to the connector 4.

Here, according to the electronic component unit 1 described above, the housing 3 includes the connector fitting portion 33 to which the connector 4 is fitted, and the reinforcing rib 31n which is formed at a position at a certain interval from the long-side wall surfaces 31c and 32c of the housing 3 and connects the connector fitting portion 33 and the inclined surface 31m. Therefore, in the electronic component unit 1, since the inclined surface 31m remains between the reinforcing rib 31n and the long-side wall surfaces 31c and 32c, for example, as illustrated in an electronic component unit 201 according to a comparative example of FIG. 11 by an arrow, it is possible to suppress a situation in which the adhered water moves to the connector 4 side across a reinforcing rib 231n. As a result, in the electronic component unit 1, the connector fitting portion 33 to which the connector 4 is fitted is reinforced by the reinforcing rib 31n, and in addition to this, it is possible to suppress adhesion of the water to the connector 4.

Furthermore, according to the electronic component unit 1 described above, the housing 3 includes the water drainage portion 32g which is formed as the long-side wall surface 32c protrudes to the lower side in the vertical direction more than the vertical-directional lower surface 31l. Therefore, in the electronic component unit 1, because the water drainage portion 32g is formed in the lower end portion of the long-side wall surface 32c, it is possible to suppress the movement of the adhered water to the vertical-directional lower surface 31l side since the water adhered to the long-side wall surface 32c or the like is drained by the water drainage portion 32g. As a result, in the electronic component unit 1, it is possible to more reliably suppress adhesion of the water to the connector 4.

In addition, the electronic component unit according to the embodiment of the present invention described above is not limited to the above-described embodiment, and can be changed in various manners within the range described in Claims of the patent.

The electronic component unit 1 described above is described as an electronic component unit which constitutes the electronic component module which is assembled to be attachable to and detachable from the electricity connection box 100, but is not limited thereto. The configuration of the electronic component unit of the embodiment may be employed in the electricity connection box 100 itself or other electronic component units, for example. For example, the electronic component 22 described above is described as a relay, but is not limited thereto, and may be a fuse or a control IC.

The electronic component unit 1 described above may have a configuration in which the reinforcing rib 31n or the water drainage portion 32g is not provided.

In addition, the electronic component unit 1 of the embodiment may be installed to be inclined at the predetermined angle with respect to the long-side direction. In this case, in accordance with the assumed installation state of the electronic component unit 1, the electronic component unit 1 may be formed by changing an inclination direction of the inclined surface 31m. Even in this case, in the electronic component unit 1, in short, in a state where the housing 3 is installed at the installation position, the inclined surface 31m may be inclined so that the long-side wall surfaces 31c and 32c sides of the housing 3 are positioned on the lower side in the vertical direction, and the connector 4 side is positioned on the upper side in the vertical direction.

In the electronic component unit according to the present invention, since the inclined surface on which the side wall surface side of the housing is positioned on the lower side in the vertical direction and the connection portion side is positioned on the upper side in the vertical direction, in a state in which the housing is installed on the bottom surface, due to the inclined surface, it is possible to suppress the movement of water adhered to the housing to the connection portion side across the bottom surface. As a result, the electronic component unit achieves an effect in which it is possible to suppress adhesion of water to the connection portion.

The present invention is based on Japanese Patent Application (No. JP-2014-117922) filed on Jun. 6, 2014, the entire subject matter of which is incorporated herein by way of reference.

What is claimed is:

1. An electronic component unit, comprising:
a housing which accommodates an electronic component therein, which includes a bottom surface in a vertical direction and a side wall surface, and to which a connection portion with electric wire is provided on the bottom surface, the connection portion extending through the bottom surface,
wherein the bottom surface of the housing includes an inclined surface extending from a first side adjacent the side wall surface to a second side adjacent the connection portion, and
wherein the first side of the inclined surface is positioned at a lower position in the vertical direction than the second side of the inclined surface,
wherein said side wall surface extends in an upwardly vertical direction from the first side of the inclined surface.

2. The electronic component unit according to claim 1, wherein the housing includes a water drainage portion which is a part of the side wall surface protruding lower in the vertical direction than the bottom surface.

3. The electronic component unit according to claim 1, wherein, in the bottom surface, the inclined surface is provided in each of both sides of the connection portion, and
wherein the bottom surface is formed in a section having a shape similar to a chevron, the first side of the each inclined surface becomes a lowermost end position and the second side of the each inclined surface becomes an uppermost end position.

4. The electronic component unit according to claim 1, wherein the housing further comprising a top cover portion disposed above a bottom portion, having said bottom surface, and forming a space therebetween for retaining a bus bar plate therein.

5. An electronic component unit, comprising:
a housing which accommodates an electronic component therein, which includes a bottom surface in a vertical direction and a side wall surface, and to which a connection portion with electric wire is provided on the bottom surface, the connection portion extending through the bottom surface,
wherein the bottom surface of the housing includes an inclined surface extending from a first side adjacent the side wall surface to a second side adjacent the connection portion, and
wherein the first side of the inclined surface is positioned at a lower position in the vertical direction than the second side of the inclined surface,
wherein the housing further includes a connection portion fitting portion to which the connection portion is fitted, and
wherein the housing includes a reinforcing rib which is formed at a position at a certain interval from the side wall surface and connects the connection portion fitting portion and the inclined surface.

* * * * *